United States Patent [19]
Schwartz

[11] Patent Number: 5,885,900
[45] Date of Patent: Mar. 23, 1999

[54] METHOD OF GLOBAL PLANARIZATION IN FABRICATING INTEGRATED CIRCUIT DEVICES

[75] Inventor: Gary Paul Schwartz, Berkeley Heights, N.J.

[73] Assignee: Lucent Technologies Inc., Murray Hill, N.J.

[21] Appl. No.: 554,501

[22] Filed: Nov. 7, 1995

[51] Int. Cl.$^6$ .................................................. H01L 21/465
[52] U.S. Cl. .......................... 438/697; 438/759; 438/760; 438/388
[58] Field of Search ............................ 437/278; 438/697, 438/759, 760, 388

[56] References Cited

U.S. PATENT DOCUMENTS

| | | | |
|---|---|---|---|
| 4,671,851 | 6/1987 | Beyer et al. | 156/645 |
| 4,944,836 | 7/1990 | Beyer et al. | 156/648 |
| 5,284,804 | 2/1994 | Moslehi | 437/228 |
| 5,312,512 | 5/1994 | Allman et al. | 186/636 |
| 5,362,669 | 11/1994 | Boyd et al. | 437/67 |
| 5,491,113 | 2/1996 | Murota | 437/225 |
| 5,516,729 | 5/1996 | Dawson et al. | 437/228 |

FOREIGN PATENT DOCUMENTS

| | | | |
|---|---|---|---|
| 0375258 | 6/1990 | United Kingdom | H01L 21/3105 |

OTHER PUBLICATIONS

R.V. Joshi, "A New Damascene Structure for Submicrometer Interconnect Wiring", *IEEE Electron Device Letters*, vol. 14, No. 3, pp. 129–132, (Mar. 1993).

IBM Technical Disclosure Bulletin vol. 27, No. 4B (Sep. 1984).

IBM Technical Disclosure Bulletin, vol. 27, No. 8 (Jan. 1985).

IBM Technical Disclosure Bulletin, vol. 27, No. 6 (Nov. 1984).

IBM Technical Disclosure Bulletin, vol. 29, No. 2 (Jul. 1986).

*Primary Examiner*—John Kight
*Assistant Examiner*—Raymond Coverington
*Attorney, Agent, or Firm*—Mathew, Collins, Shepherd & Gould, P.A.

[57] ABSTRACT

Global planarization of a non-planar substrate surface is accomplished using a sacrificial material in conjunction with an etching and chemical-mechanical polishing (CMP) technique. The sacrificial material has a greater rate of removal relative to the substrate during the CMP process and at a lesser rate relative to the material during the etching process. The use of the sacrificial material enables the etching process to substantially reduce the height of topographic features that occur in the non-planar surface. The CMP process is then performed on the etched material surface to produce a planarized material surface that is substantially free of feature dependent dishing. Such a process is useful for planarizing material layers in fabricating integrated circuit devices as well as for planarizing recessed structures in such devices.

20 Claims, 4 Drawing Sheets

METHOD OF GLOBAL PLANARIZATION IN FABRICATING INTEGRATED CIRCUIT DEVICES

FIELD OF THE INVENTION

The invention relates to fabricating integrated circuit devices in general and more specifically, to global planarization in such devices using a combined chemical-mechanical polishing and etching technique.

BACKGROUND OF THE INVENTION

Typical ultra large scale integration (ULSI) and very large scale integration (VLSI) semiconductor chips include arrays of electrical devices having contacts interconnected by patterns of metal strips. The patterns of metal strips in these chips are often multi-layered and separated by layers of an insulating material. During fabrication, it is desirable to produce substantially planar surfaces in forming these layers.

Planar device layers are necessary to facilitate masking and etching procedures. A planar surface provides a critical constant depth of focus across the device for exposing patterns during photolithographic operations to produce sharply focused features in the corresponding layer patterns. In addition, planar surfaces contribute to the formation of device layers having constant thicknesses across a semiconductor wafer. The constant thicknesses of the layers improve the yield of dies cut from the wafer and the reliability of such dies.

Nevertheless, fabrication of planar device surfaces including those having recessed or damascene structures, such as interconnect strips, has presented complications with conventional etch back techniques. Presently, plasma etching or reactive ion etching (RIE) of metals with a resist planarizing medium are used for planarization in fabricating recessed structures. A description of an exemplary RIE process is provided in R. Kraft and S. Prengle, "High-Density Plasma Etching 0.35 Micron Polysilicon Gates", *Solid State Technology*, pp. 57–60 (August, 1995), which is incorporated by reference herein. However, these techniques tend to suffer from increasingly poor yield as device geometries increasingly become smaller than 0.5 μm.

Another planarization technique is chemical mechanical polishing (CMP). CMP is typically performed by polishing a semiconductor wafer on a rotating platen using a slurry typically composed of fumed silica or alumina suspended in an aqueous-based solution. Exemplary CMP methods are described in R. Jairath et al., "Chemical Mechanical Polishing: Process Manufacturability", *Solid State Technology*, pp. 71–77 (July, 1994), which is incorporated by reference herein. However, such a polishing process for global planarization of dielectric materials, such as silicon dioxide, or soft metals, such as aluminum and copper, tend to cause "dishing". "Dishing" refers to the excessive removal of material in one or more regions during planarization causing the surface in such regions to be lower relative to surrounding surface regions. In particular, application of a CMP process to structures recessed in a substrate tends to cause dishing of the recessed structure relative to the surrounding substrate surface rather than planarization.

The degree of dishing that occurs during such polishing is strongly topographic feature size dependent. Wide depressed regions in a surface tend to polish faster than narrow depressed regions. As a consequence, wide depressed regions typically experience a higher degree of dishing than narrow depressed regions. Exemplary wide recessed structures include power buses which often have widths greater than 200 μm on the same device layer as signal interconnect strips having widths less than 0.5 μm.

Hard mask materials, such as silicon nitride, that polish at a slower rate than the material of the recessed structures have been deposited over the recessed structures in order to reduce the amount of dishing. Exemplary planarization methods that employ hard masks are described in U.S. Pat. No. 5,362,669, which is incorporated by reference herein. However, such use of hard masks reduces but does not necessarily eliminate dishing. Moreover, the hard mask must polish at a much lower rate during the CMP process than the recessed structure material. Accordingly, the processing time required for such planarization is often much longer than that required by other conventional planarization techniques. As a consequence, this technique tends to significantly increase the overall device fabrication time which is undesirable in the commercial production of large quantities of the devices.

Thus, planarization techniques that limit dishing and device fabrication times is desirable.

SUMMARY OF THE INVENTION

Global planarization of a non-planar surface of a substrate is performed using a sacrificial material in conjunction with an etching process and a chemical-mechanical polishing (CMP) technique. The sacrificial material should have a greater rate of removal relative to the substrate during the CMP process and lesser rate of removal relative to the material during the etching process.

In accordance with the invention, the sacrificial material is formed on depressed regions of the non-planar substrate surface. The substrate surface and sacrificial material are then etched to substantially reduce the height of topographic features occurring in the substrate surface outside of the depressed regions. The CMP process is then performed on the etched substrate surface and remaining sacrificial material to produce a planarized substrate surface that is substantially free from topographic feature dependent dishing.

Since the sacrificial material has a slower rate of removal during etching than the substrate, the sacrificial material hinders the removal of the material layer surface in the depressed region during the etching process. Such selective removal of substrate material results in a reduction of the topographic features of the substrate surface occurring at areas outside of the depressed region. The sacrificial material that remains after the etching process does not act as a topographic feature during the CMP process because the sacrificial material has a greater rate of removal than the substrate during such process.

It is possible to use this global planarization process to planarize a layer of a wafer in fabricating integrated circuit devices. It is further possible to use this process to planarize recessed structures in the integrated circuit device. In forming a planarized recessed structure or plug, a layer of a plug material is formed over a region of the substrate containing a recess. The material layer should fill the recess and cover the surface of the substrate proximate the recess. A corresponding surface of the material layer is non-planar with a depressed region occurring in an area substantially over the substrate recess. The sacrificial material is then formed in the depressed region of the material layer. The sacrificial material and the plug material layer are then etched to reduce the height of topographic features occurring in the material layer surface. The CMP process is then performed to remove the sacrificial material and portions of the material layer to expose a surface of the substrate and produce the planarized plug which is substantially free from topographic feature dependent dishing.

The invention is particularly advantageous in the commercial production of large quantities of devices because it can be performed relatively rapidly.

Additional features and advantages of the present invention will become more readily apparent from the following detailed description and accompanying drawings.

DETAILED DESCRIPTION

The invention is based on the discovery that a sacrificial material having particular characteristics can be used with an etching and CMP technique to perform global planarization of a non-planar substrate surface. The sacrificial material should have the particular characteristics of a greater rate of removal relative to the substrate during the CMP process and a slower rate during the etching process. As a consequence, during the etching process, the removal of material is substantially hindered in those areas of a substrate surface under the sacrificial material. The etching process is employed after sacrificial material is formed over depressed regions of the surface to substantially reduce the height of topographic features that occur in the non-planar surface. Since the etched substrate surface has reduced topographic features, a CMP process is then used to remove the remaining sacrificial material and topographic features of the surface to form a planarized surface substantially free of feature dependent dishing. The sacrificial material that remains after the etching process does not hinder or act as topographic features for the CMP process because the sacrificial material has a greater rate of removal than the material layer during the CMP process.

Exemplary embodiments of the invention are described in detail below with regard to global planarization of an insulating layer of a substrate in fabricating an integrated circuit device and to the formation of planarized recessed metal structures in the substrate. However, global planarization according to the present invention is also useful in, for example, planarizing other device layers during the fabrication of integrated circuits on semiconductor wafers, as well as the formation of other planarized recessed structures.

Figure 1:
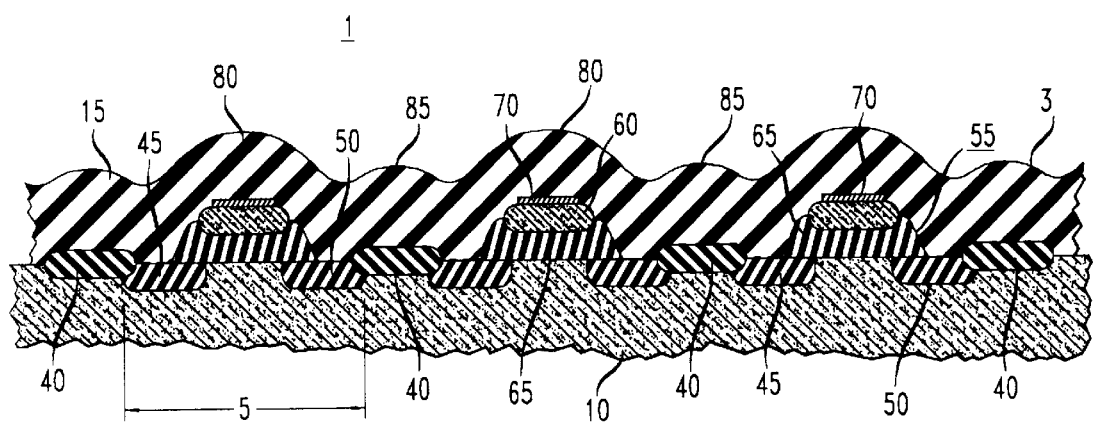
FIGS. 1–4 illustrate a cross-sectional view of a portion of an exemplary integrated circuit device at successive stages of global planarization in accordance with the invention.

FIG. 1 shows a portion of an exemplary substrate 1 during the fabrication of an integrated circuit device. The substrate 1 includes an insulating layer 15 of, for example, an oxide doped with phosphorus, that is deposited on a semiconductor base 10, such as a silicon base. The insulating layer 15 of the substrate 1 has a non-planar surface 3 that can be planarized using the global planarization technique of the present invention.

A plurality of transistors 5, such as conventional metal-oxide-semiconductor field effect transistors (MOSFETs), are formed on the base 10 and covered by the insulating layer 15. The particular type of active device used for each transistor 5 is not critical for practicing the invention and can be NMOS, PMOS or CMOS. Other suitable active devices include, for example, bipolar junction transistors and GaAs MESFETs. Each transistor 5 can be fabricated, for example, by conventional processing methods, such as the method described in detail in S. M. Sze, *VLSI Technology*, Chap. 11, pp. 466–515 (McGraw-Hill 1988), which is incorporated by reference herein. Each transistor 5 includes field oxide regions 40 which are formed, for example, by $SiO_2$ and operate as insulators between each of the transistors 5.

Source and drain regions 45 and 50 of each transistor 5 are formed by doping with n-type impurities, such as arsenic or phosphorous for NMOS. A gate 55 of each transistor 5 includes, for example, polysilicon 60 doped with an n-type impurity such as by implant. The gate polysilicon 60 is disposed on a gate oxide 65. An optional layer of silicide 70 over the gate polysilicon 60 is formed to reduce the electrical resistance of the gate 55. Since each gate 55 is formed by multiple layers, the corresponding contact surface of the silicide tends to be higher or elevated compared to corresponding contact surfaces of each of the source and drain regions 45 and 50.

The insulating layer 15 is formed over and covers each of the transistors 5. The insulating layer top surface 3 approximately conforms to the topology of the semiconductor base 10 and transistors 5 such that high regions 80 exist in the top surface 3 above each of the gates 55. Depressed regions 85 of the top surface 3 exist between the high regions 80 and occur above regions of each transistor 5, such as the field oxide regions 40 and source and drain regions 45 and 50. However, the insulating layer top surface 3 does not exactly conform to the topology of the semiconductor base 10 and transistors 5 because topographic features of the top surface 3 including the high regions 80 tend to be wider and not as high as well as have a more curved shape than the protrusions, such as the transistor gates 55, present on the base 10. Further, depressed surface regions would occur over recesses in the substrate as is discussed below with regard to FIG. 5. Such depressed surface regions tend to be narrower and less deep than the corresponding recess in the substrate 1.

Figure 2:
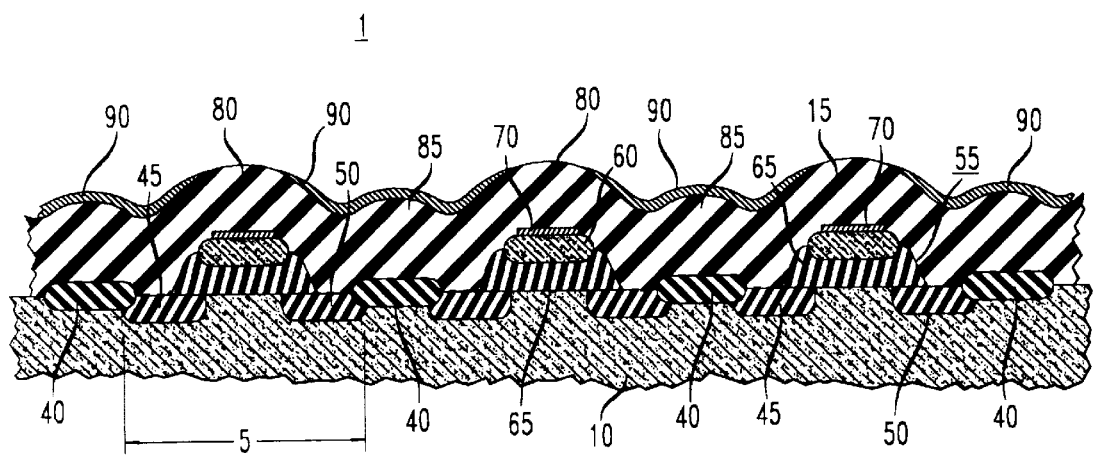
Figure 3:
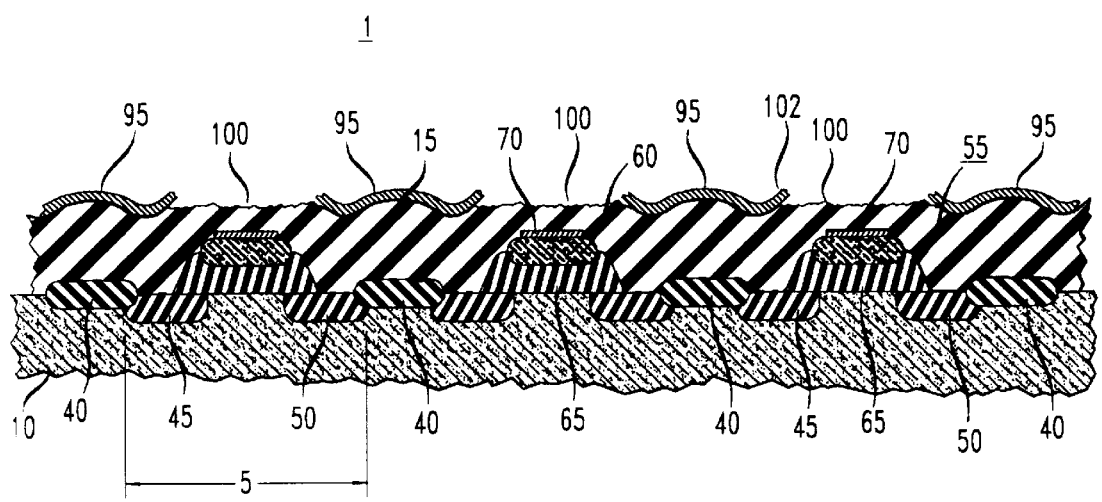
Figure 4:
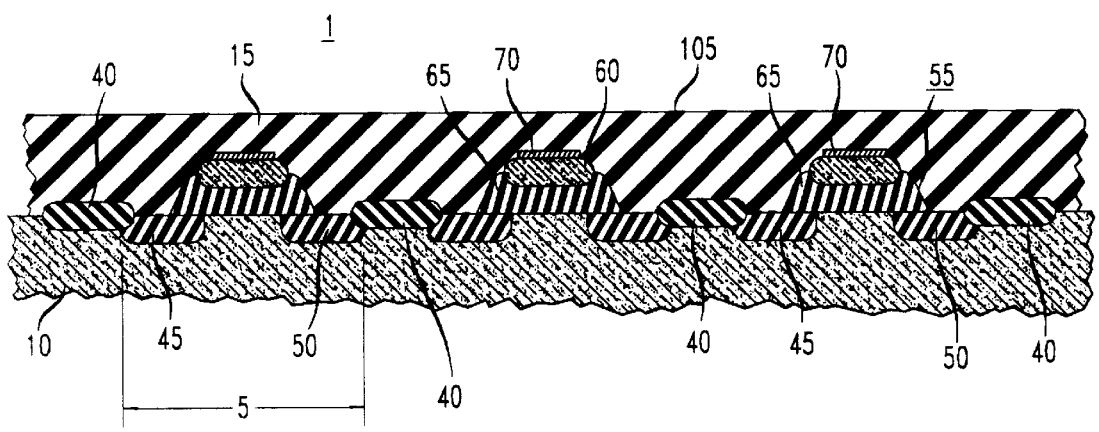

In accordance with the invention, it is possible to planarize the non-planar insulating layer surface 3 to form the planarized surface 105 shown in FIG. 4. The results of the process steps in planarizing the surface 3 in performing the method of the invention are shown in FIGS. 2 and 3. Identical components in FIGS. 1–4 are like numbered for clarity.

During planarization, a sacrificial material 90 is first formed in the depressed regions 85 as is shown in FIG. 2. The sacrificial material 90 should possess the characteristics of a greater rate of removal relative to the substrate insulating layer 15 during a selected CMP process and lesser rate of removal relative to the material during a selected etching process. Suitable materials for the sacrificial material 90 include, for example, titanium, titanium nitride and photoresist. A suitable thickness of the sacrificial material 90 is in the range of 0.1–0.25 µm.

It is possible to form the sacrificial material 90 in the depressed regions 85 of the top surface 3 by first forming a layer of the sacrificial material over a portion of the insulating layer 15 containing both the high and the depressed regions 80 and 85. Then, the CMP process is performed for a relatively short period of time to sufficiently remove portions of the sacrificial material layer over the high regions 80 while leaving sacrificial material 90 remaining in the depressed regions 85. Performing the CMP process for an excessive period of time will disadvantageously remove portions of the sacrificial material from the depressed regions 85. It is possible to perform the CMP process by polishing the substrate on a rotating platen using a slurry typically composed of, for example, fumed silica or alumina suspended in an aqueous-based solution. This and other exemplary CMP methods are described in detail in the previously cited R. Jairath et al. article.

The sacrificial material 90 and exposed high regions 80 of the insulating layer 15 are then etched to reduce or lower the high regions of the insulating layer 15 relative to the depressed regions 85 to form the etched insulating layer surface 100 in FIG. 3. Exemplary etching techniques include wet and dry etching processes. Suitable dry etchants include, for example, mixtures of $C_2F_6$ and $O_2$, or $CHF_3$ and $O_2$. When photoresist is used for the sacrificial material 90, exemplary wet etchants include HF and buffered HF. It should be understood that the particular wet or dry etchant used should interact with the sacrificial material and insulating layer 15 in the prescribed manner according to the present invention.

The etching process reduces the height of regions 80 of the top surface 3. Since the sacrificial material 90 etches at a slower rate than the insulating layer 15, the sacrificial material 90 substantially hinders the removal of the insulating layer material in the depressed regions 85. As a consequence, the height of the topographic features of the insulating layer top surface 3 in FIG. 2 is effectively reduced as the height of the regions 80 are reduced to a level closer to the depressed regions 85. Also, due to the different rate of removal of the sacrificial material 90 and the insulating layer 15, it is possible for the etchant to remove portions of the insulating layer 15 under edge regions of the sacrificial material leaving raised edges 102 of the sacrificial material as is depicted in FIG. 3. The sacrificial material remaining after the etching step is indicated by reference number 95 in FIG. 3.

The CMP process is then performed to remove the remaining sacrificial material 95 and a portion of the etched insulating layer top surface 100 in order to form a planarized surface 105 as is shown in FIG. 4. As is stated above, dishing of the surface of recessed structures caused by a CMP process is significantly dependent on differences in topography of the material surface to be polished. Since the etching process, described above with regard to FIG. 3, advantageously produces an insulating layer surface 100 with substantially reduced topographic features, the final CMP process forms the planarized surface 105 substantially free of topographic feature dependent dishing. Further, since the sacrificial material is removed at a faster rate than the insulating layer 15, the removal of the remaining sacrificial material 95 by the CMP process does not act as topographic features that detrimentally effects the planarization of the insulating layer etched surface 100.

Figure 5:
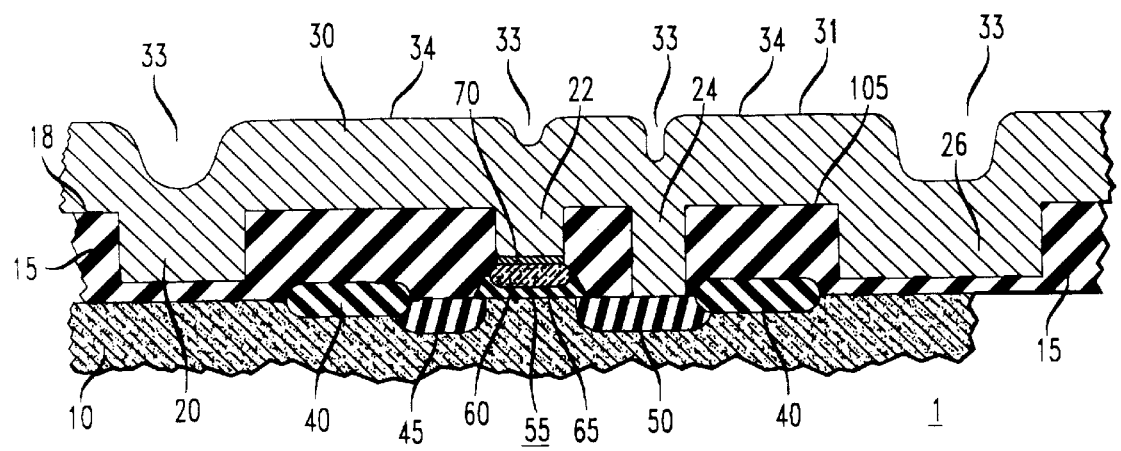
FIGS. 5–7 illustrate a cross-sectional view of a portion of an exemplary integrated circuit device at successive stages in forming planar recessed structures in accordance with the invention.

It is further possible to form recessed material structures in a substrate using the process of the present invention. For instance, recessed metal structures such as aluminum, copper or tungsten structures can be formed in the insulating layer 15 of the substrate 1 of FIG. 4 to provide a power bus and local interconnections for each transistor 5. FIG. 5 shows a portion of the substrate 1 of FIG. 4 that contains a single transistor 5 and recesses 20, 22, 24 and 26 (recesses 20–26) of different widths and depths in the insulating layer 15 for formation of the recessed metal structures. It is possible to form the recesses 20–26 by, for example, etching a pattern defined by conventional photolithographic techniques described in S. Okazaki, "Lithographic Technologies for Future ULSI", *Applied Surface Science*, no. 70/71, pp. 603–612 (1993), which is incorporated by reference herein.

Figure 7:
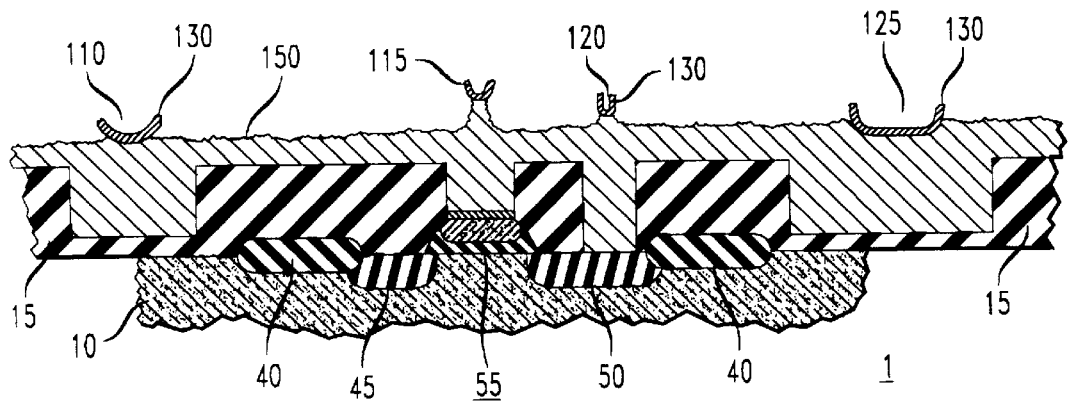
Figure 8:
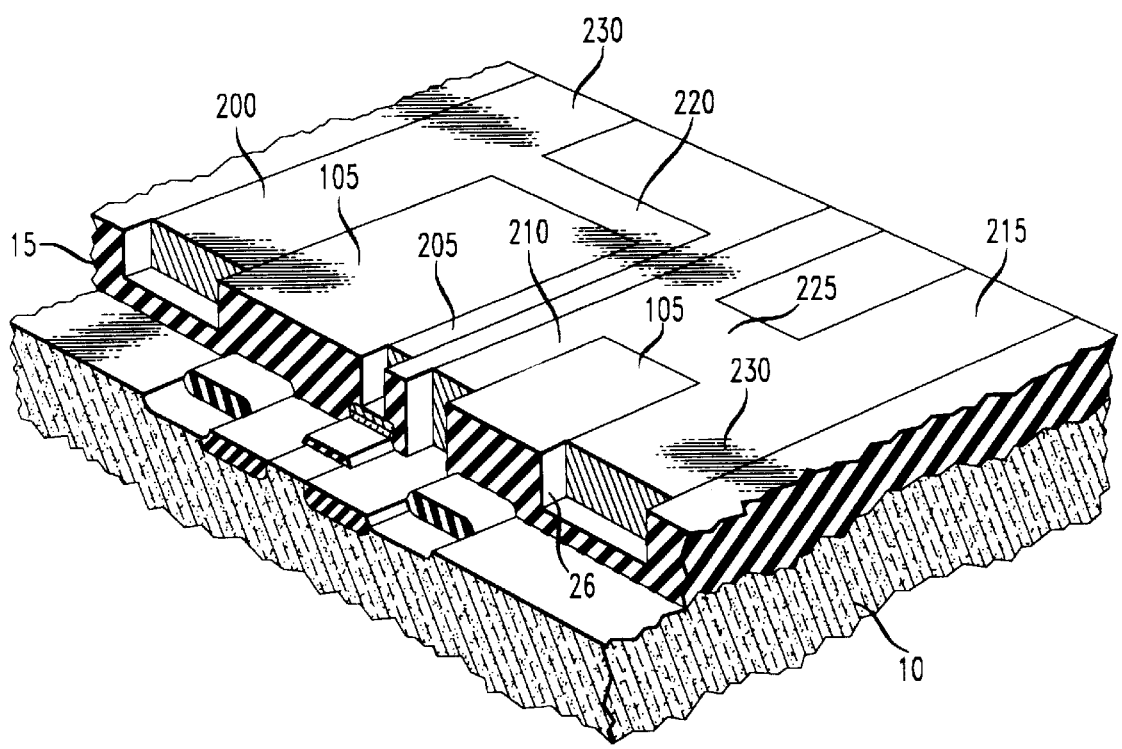
FIG. 8 illustrates a partial cut-away perspective view of the device portion of FIGS. 5–7 with completed recessed structures.

The recessed metal structures or interconnect strips formed in the recesses 20–26 should have a surface 230 that is substantially planar with the surface 105 of the insulating layer 15 as is shown in FIG. 8. Identical components in FIGS. 5–8 and corresponding FIGS. 1–4 are like numbered for clarity. The recesses 20–26 are formed in specific patterns in the substrate 1 to provide the desired interconnections. Although interconnect strips are formed in the recesses 20–26 depicted in FIG. 5, it should be understood that in accordance with the present invention it is possible to form planar recessed structures in a recess of any arbitrary shape.

Typically, a contact is used to couple an interconnect strip to a transistor source, gate or drain. As a result, the interconnect strips are typically not in direct contact with such transistor regions. However, in FIGS. 5–8, the contacts have been omitted and the interconnect strips and corresponding recesses have been shown directly connected to such transistor regions for ease of illustration and discussion purposes. It should be readily understood that it is possible to form a recessed metal structure for an interconnect strip containing an embedded recessed contact in accordance with the invention by first creating a recess of the desired shape of the contact and interconnect strip. Also, although only the drain and gate regions 50 and 55 of the transistor 5 are exposed in the cross-section of the integrated circuit illustrated in FIG. 5, it should be readily understood that the source region 45 is exposed at another area of the substrate 1 that is outside the illustrated cross-section.

The size and shape of the recesses 20–26 are selected based on the desired shape of the corresponding formed interconnect strips. For instance, the recesses 22 and 24 form interconnects to the drain and gate regions 50 and 55 of transistor 5 and would have a width in the range of, for example, 0.3–1.0 $\mu$m and a recessed depth in the range of 0.5–1.5 $\mu$m for typical ULSI and VLSI devices exclusive of any corresponding contacts. In contrast, the recess 26 is used to form a power bus strip which typically possesses a width in the range of 50–250 $\mu$m and recessed depth of approximately 0.5 $\mu$m in such devices. Note that the substrate 1 shown in FIGS. 1–8 is not drawn to scale. The recess 22 is used to form a local interconnect and can have a width in the range of, for example, 0.5–1.5 $\mu$m and a recessed depth in the range of 0.5–1.5 $\mu$m in such devices. FIG. 8 shows an exemplary interconnect configuration where the formed gate and drain interconnect strips 205 and 210 are connected to the resulting interconnect bus 200 and power bus 215 by cross interconnects 220 and 225, respectively.

Referring to FIG. 5, a layer of electrically conductive material 30, such as aluminum, is formed over the top surface 105 of the insulating layer 15 and completely fills the recesses 20–26. The aluminum layer 30 approximately conforms to the topography of the substrate 1 such that its top surface 31 will have a topography that approximately corresponds to the insulating layer surface 105 and recesses 20–26. Accordingly, depressed regions 33 in the surface 31 occur over the recesses 20–26, and high regions 34 occur over non-recessed portions of the insulating layer 15.

The depressed regions 33 formed over the recesses 20–26 will have respective widths that are less than the widths of the corresponding recesses. Moreover, depressed regions 33 formed over relatively narrow recesses in which the recess width is, for example, less than approximately twice the recess depth, are not as deep relative to the recess depth as the depressed regions 33 formed over wider recesses. For instance, a bottom portion of the depressed region 33 over the narrow recess 24 does not extend to the depth of the recess 24. In comparison, the depressed region 33 over the significantly wider recess 26 would have a depth substantially corresponding to the depth of the wider recess 26 and a bottom portion that substantially conformed to the shape of a bottom portion of the corresponding recess 26.

A sufficient amount of aluminum is formed on the substrate 1 such that the aluminum surface 31 in the depressed regions 33 is above the level of the desired planarized surface which, in the illustrated example, is the level of the insulating layer surface 105. One exemplary method of insuring that the aluminum surface 31 is sufficiently above the required level is to form the aluminum layer 30 having a thickness that is greater than the approximate depth of a deepest portion of the deepest recess. It is possible to form such an aluminum layer 30 by forming the layer with an approximate thickness or depth of 5% to 25% larger than the approximate depth of the deepest recess portion. For instance, if the depth of the deepest portion of the deepest recess is at a depth of approximately 1 $\mu$m then it is possible to form the aluminum layer 30 with a thickness on the order of 1.2 $\mu$m which is 20% larger than such depth.

Figure 6:
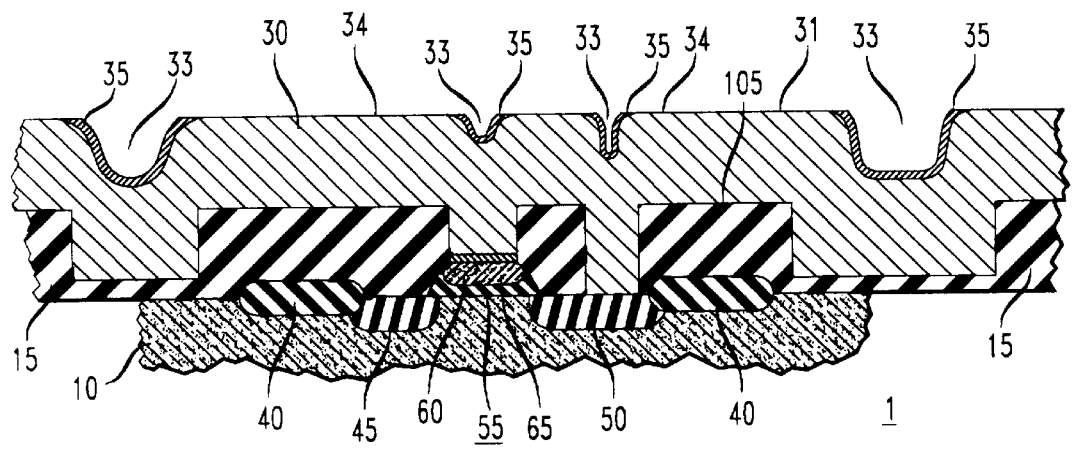

The planar interconnect strips 200–215, shown in FIG. 8, are formed in the recesses 20–26 according to the method of the invention in the following manner. Sacrificial material 35 is formed in the depressed regions 33 of the aluminum layer 30 as is shown in FIG. 6. The sacrificial material 35 should possess the characteristic of a greater rate of removal relative to the aluminum 30 during a selected CMP process used and a lesser rate of removal during a selected etching process used. A suitable thickness of the sacrificial material 35 is in the range of 0.1–0.25 $\mu$m.

An exemplary method for forming the sacrificial material 35 is to first form a layer of sacrificial material covering at least a portion of the aluminum surface 31 including the depressed regions 33. Then, the CMP process is performed for a relatively short period of time to sufficiently remove portions of the sacrificial material layer over the high surface regions 34 and to leave sacrificial material 35 remaining in the depressed regions 33. It is possible to use, for example, the materials for the sacrificial material 35 and the particular CMP processes that are recited above with respect to FIGS. 1–4.

The sacrificial material 35 and exposed high regions 34 of the aluminum layer 30 are then etched to reduce the level of the high regions 34 relative to the depressed regions 33 to form the surface 150 as is shown in FIG. 7. The reduction of the level of the high regions 34 effectively reduces the height of topographic features in the aluminum surface 31. Since the sacrificial material 35 etches at a slower rate than aluminum, the portions of the aluminum layer surface 31 under those regions are substantially protected from the etchant. A suitable wet etching technique is, for example, a phosphoric acid etch composed of phosphoric acid, nitric acid, acetic acid and water in the approximate ratios of 16:1:1:2. It should be understood that the particular etchant used should interact with the sacrificial material and insulating layer 15 in the prescribed manner according to the present invention.

During the etching process, the sacrificial material 35 is partially reduced as shown by the remaining regions 110, 115, 120 and 125. It is possible for raised portions 130 of the sacrificial material 35 to form in the regions 110–125 due to the difference in the rate of removal of the sacrificial material 35 relative to the aluminum under edge regions of the sacrificial material 35. The height of the topographic features in the aluminum surface 31 should be sufficiently reduced by the etching process such that any resulting variations in etched surface 150 can be substantially removed by the subsequent CMP process.

The remaining sacrificial material 110–125 and a portion of the aluminum layer 31 are then removed by the CMP process to expose the insulating layer surface 105. As a result, the recessed aluminum strips 200, 205, 210 and 215 are formed in the recesses 20–26 with surfaces 230 that are planar with the insulating layer surface 105 as is shown in FIG. 8. As is stated above, dishing of the surface of recessed structures caused by the CMP process is significantly dependent on differences in topography of the material surface to be polished. Since the etching process, described above with regard to FIG. 3, advantageously produces an aluminum surface 150 with substantially reduced topographic features, the final CMP process forms the planarizing recessed aluminum strips 200–215 substantially free of topographic feature dependent dishing. Further, since the remaining regions of the etched sacrificial material 110–125 are removed at a faster rate than aluminum by the CMP process, those regions do not act as topographic features during the CMP process to detrimentally effect the planarization of the corresponding recessed aluminum strips 200–215.

The planarization method of the invention can be performed relatively rapidly in forming the planar recessed structures substantially free of dishing. In the examples described with respect to the substrate 1 shown in FIGS. 1–4 and FIGS. 5–8, it is possible to perform the first CMP process to form the sacrificial material regions 90 and 35 in FIGS. 2 and 6 in 30 to 60 seconds per wafer substrate, the etching process in approximately two minutes per batch of, for example, 25–50 wafer substrates, and the final CMP process in less than three minutes per wafer substrate.

Although two embodiments of the invention have been described in detail above, many modifications can be made without departing from the teaching thereof. All of such modifications are intended to be encompassed within the following claims. For instance, although the invention is depicted and described with regard to global planarization of an insulating layer and formation of planarized recessed metal strips, the invention can also be used to planarize other layers of a substrate and form other recessed structures as long as the corresponding selected sacrificial material is removed at a faster rate relative to the material to be planarized during a CMP process and at a slower rate relative to the material during etching. The invention is useful in forming planar surfaces for each layer in an integrated circuit device such as in typical ULSI and VLSI devices.

The invention claimed is:

1. A method for planarizing a non-planar surface layer of an integrated circuit device having at least one depressed region and a plurality of exposed high regions, the method comprising the steps of:

forming a sacrificial material in the at least one depressed region of the non-planar surface layer, wherein the sacrificial material is subject to both etching and chemical-mechanical polishing and has an etching rate lower than the etching rate of the material comprising the surface layer and a polishing rate greater than the polishing rate of the material comprising the surface layer;

etching the exposed high regions of the surface layer and the sacrificial material, wherein the sacrificial material having a lower etching rate than the surface layer substantially hinders the removal of the surface layer in the at least one depressed region so that the etching substantially reduces the exposed high regions approximately to the height of the at least one depressed region and partially reduces the sacrificial material; and chemical-mechanical polishing (CMP) the surface layer and the remaining sacrificial material, wherein the sacrificial material is removed at a faster rate than the surface layer so that the CMP step forms a planarized surface substantially free of feature dependent dishing.

2. The method of claim 1 wherein the step of forming the sacrificial material comprises:

forming the sacrificial material on a region of the substrate surface including the depressed region; and chemical-mechanical polishing the formed sacrificial material to remove the sacrificial material from areas of the substrate surface outside of the depressed region.

3. The method of claim 1 wherein said substrate surface comprises a dielectric layer surface.

4. The method of claim 1 wherein the sacrificial material is a metal containing titanium.

5. The method of claim 4 wherein the sacrificial material is titanium nitride.

6. The method of claim 5 wherein the etching step employs a dry etchant and said substrate surface comprises an oxide layer surface.

7. The method of claim 5 wherein the etching step employs a wet etchant and said substrate surface comprises an aluminum layer surface.

8. The method of claim 1 wherein the sacrificial material is photoresist.

9. The method of claim 8 wherein the etching step employs a wet etchant and said substrate surface comprises an oxide layer surface.

10. The method of claim 8 wherein the etching step employs a wet etchant and said substrate surface comprises a aluminum layer surface.

11. A method for forming recessed structures in fabricating an integrated circuit device comprising:

forming a material layer on at least a portion of a substrate having at least one recess, said material layer being formed over a surface of the substrate portion proximate the recess and filling the recess, wherein a depressed region of the material layer surface is formed over the recess;

forming a layer of a sacrificial material on the material layer surface in the depressed region, wherein the sacrificial material is subject to both etching and chemical-mechanical polishing and has an etching rate lower that of the material layer surface and a polishing rate greater that of the material comprising the surface layer;

etching the material surface layer and the sacrificial material, wherein the sacrificial material having a lower etching rate than the surface layer substantially hinders the removal of the surface layer in the at least one depressed region so that the etching substantially reduces the height of topographic features occurring in the material surface layer to approximately the height of the depressed regions; and chemical-mechanical polishing (CMP) the etched material layer and the remaining sacrificial material, wherein the sacrificial material is removed at a faster rate than the surface layer so that the CMP step exposes the substrate surface and forms a planarized plug in the recess substantially free of feature dependent dishing.

12. The method of claim 11 wherein the step of forming the sacrificial material on the material layer surface comprises:

forming the sacrificial material on a region of the material layer surface including the depressed region; and chemical-mechanical polishing the formed sacrificial material to remove the sacrificial material from regions outside of the depressed region.

13. The method of claim 12 wherein the formed recessed structures are conductive metal strips.

14. The method of claim 13 wherein the material layer is aluminum.

15. The method of claim 13 wherein the material layer is tungsten.

16. The method of claim 13 wherein the material layer is copper.

17. The method of claim 11 wherein the sacrificial material is a metal containing titanium.

18. The method of claim 17 wherein the sacrificial material is titanium nitride.

19. The method of claim 11 wherein the sacrificial material is photoresist.

20. An improved method for rapidly planarizing a dielectric layer of an integrated circuit device, the dielectric layer having an upper surface comprising heightened and depressed regions, the method comprising the steps of:

disposing a sacrificial material in at least one depressed region of the dielectric layer, wherein the sacrificial material is fabricated with a metal comprising titanium, is subject to both etching and chemical-mechanical polishing, and has an etching rate lower than that of the material comprising the dielectric layer and a polishing rate greater than that of the material comprising the dielectric layer;

etching both the sacrificial material and the heightened regions, wherein the sacrificial material hinders the etching of the dielectric layer at the at least one depressed region so that the height of the topographic features occurring on the upper surface of the dielectric layer are substantially reduced; and chemical-mechanical polishing (CMP) both the remaining sacrificial material and the dielectric layer, wherein the sacrificial layer is removed at a faster rate than the dielectric layer to provide a planarized surface substantially free of feature dependent dishing, wherein the CMP step to provide the planarized surface may be performed in less than about three minutes.

* * * * *